United States Patent [19]

Hu

[11] 4,412,354
[45] Oct. 25, 1983

[54] MILLIMETER-WAVE STRIPLINE PLANAR MIXER

[75] Inventor: Chi P. Hu, Santa Barbara, Calif.

[73] Assignee: Honeywell Inc., Minneapolis, Minn.

[21] Appl. No.: 364,289

[22] Filed: Apr. 1, 1982

[51] Int. Cl.³ .............................................. H04B 1/26
[52] U.S. Cl. .................................... 455/327; 455/328; 455/330
[58] Field of Search ....................... 455/327, 328, 330; 363/158, 159; 333/26

[56] References Cited

U.S. PATENT DOCUMENTS 3,584,306  6/1971  Spacek ............................. 455/327
4,270,224  5/1981  Blondel et al. ..................... 455/327
4,276,655  6/1981  Kraemer et al. .................... 455/327

OTHER PUBLICATIONS

"A Broad-Band, Low Noise Receiver at W-Band" by Hu et al., 15-19, Jun. 1981.

Primary Examiner—Jin F. Ng
Attorney, Agent, or Firm—Roger W. Jensen

[57] ABSTRACT

A millimeter-wave stripline planar mixer to provide a means for mixing a local oscillator signal with a radio frequency signal to produce an intermediate frequency signal, the mixer utilizing beam lead schottky-barrier diodes in a balanced configuration.

10 Claims, 5 Drawing Figures

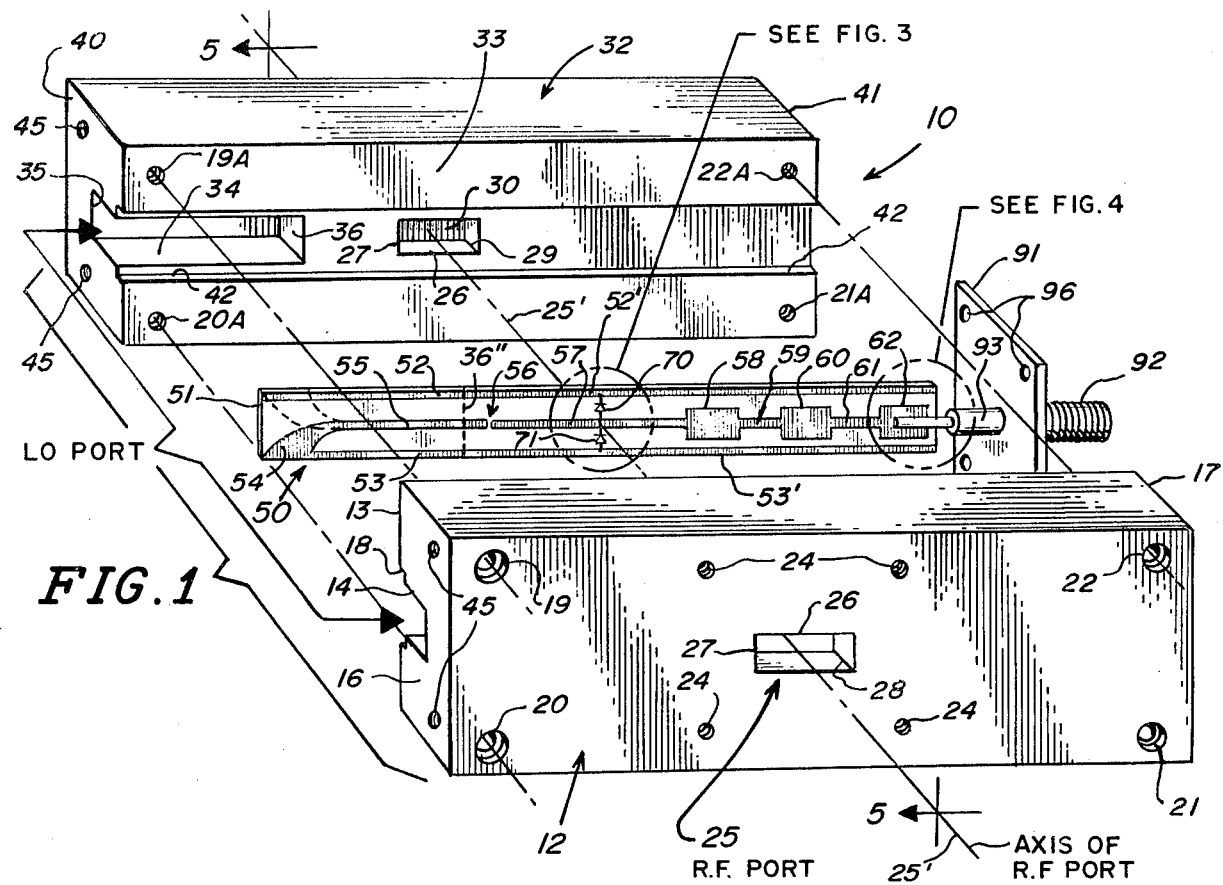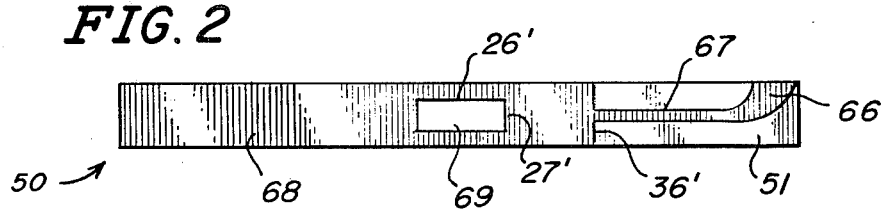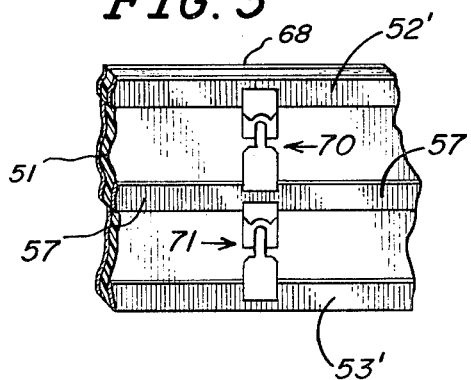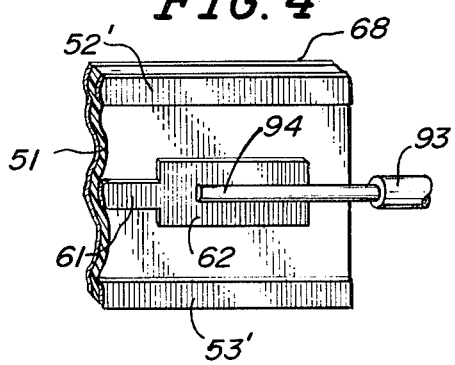

MILLIMETER-WAVE STRIPLINE PLANAR MIXER

SUMMARY OF THE INVENTION

This invention relates in general to a millimeter-wave signal mixer, i.e., the mixing of a local oscillator signal with an R.F. or radio frequency signal to produce an intermediate frequency or I.F. signal, the mixer employing beam lead schottky-barrier diodes in a balanced configuration. The present invention provides a novel type of mixer in which the band width and operating frequency limitations of prior art apparatus are avoided. The full wave band mixer capability is especially desirable for applications in radar warning, EHF, EMS and ELINT applications that must serve a large band width searching for possible emitters in the frequency spectrum.

BRIEF DESCRIPTION OF THE DRAWINGS

The invention is illustrated in the accompanying drawings, wherein:

FIG. 1 is an exploded isometric view of the apparatus comprising the invention;

FIG. 2 is a view of the back side of the flat stripline base member of FIG. 1;

FIG. 3 is an enlargement from FIG. 1 showing the connection details of the pair of mixer diodes;

FIG. 4 is an enlargement from FIG. 1 showing the details of the connection from the microstrip to the I.F. output means.

DETAILED DESCRIPTION OF THE PREFERRED EMBODIMENT

Figure 5:
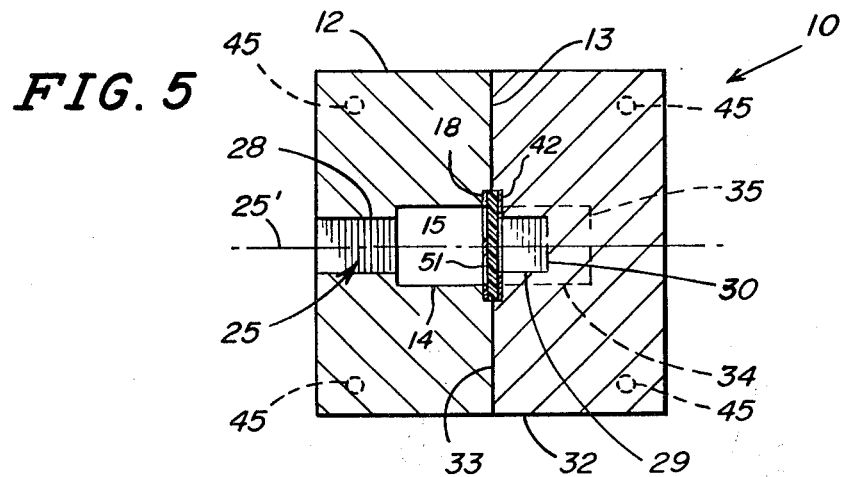
FIG. 5 is a cross-section of the apparatus of FIG. 1 when assembled as taken along the axis 25' of the R.F. port 25.

Referring to FIG. 1, reference numeral 10 depicts a millimeter-wave stripline planar wide-band mixer comprising an elongated housing member having a first end 40 and a second end 41. The housing member comprises first and second rectangularly shaped block members 12 and 32 each having a flat face surface 13 and 33 respectively.

Block member 12 and 32 are adapted to be held together with surfaces 13 and 33 in abutting relationship by suitable screw means, not shown, which pass through suitable apertures 19, 20, 21 and 22 in block 12 into suitable threaded apertures 19a, 20a, 21a and 22a in block 32.

Elongated housing member 12/32 is provided with an internal elongated enclosure extending from one end to the other. More specifically, the elongated enclosure takes the form of a pair of relatively shallow recesses 18 and 42 in blocks 12 and 32 respectively which extend from one end of the housing member 12/32 to the other and, when, as aforesaid, the two blocks 12 and 32 are assembled in abutting relationship, form the aforesaid elongated enclosure. Positioned within the enclosure is an elongated flat stripline base member 50. As depicted in FIG. 1, flat stripline base member 50 has a flat elongated shape with a core member made out of an appropriate insulative material, such as soft duroid.

A first relatively deep recess 14 is provided in block member 12 in register with the enclosure and extending from said enclosure into the block member along all of one side or along the entire length of said stripline member. The depth of the rectangular recess 14 is equivalent to the half of the broad side dimension of the waveguide. So is true for the recess 34.

A second relatively deep recess 34 is provided in the housing block 32; this recess however only extends along a relatively short portion of the other side of the stripline member beginning at end 40 of the housing member. The recess 34 terminates with an end wall 36. The depth of recess 34 is the same as recess 14. The length of recess 34 is typically longer than three wavelengths of the local oscillator frequency. Therefore, it is long enough to accommodate a waveguide-to-microstripline transition 54/55 on the stripline member.

When the blocks 12 and 32 are connected together with the faces 13 and 33 in abutting relationship, then the two relatively deep recesses 14 and 34 collectively define a port to which may be applied a local oscillator frequency, this being depicted in FIG. 1 with the legend "L.O. port". Conventional means, not shown, are provided for applying a local oscillator (L.O.) signal to the first end of the housing blocks 12/32, said means including a plurality of threaded apertures 45 in the end faces of housing blocks 12 and 32 for attachment thereto of standard microwave adaptor apparatus.

A radio frequency (R.F.) port 25 passes completely through housing block 12 along an axis 25' which is at right angles to the axis of the enclosure 18/42. The axis 25' is adapted to pass through the center of the stripline base member 50/51. The R.F. port extends along axis 25' into housing block 32 extending approximately a quarter wave length (of the R.F.) beyond said elongated enclosure. The R.F. port has a rectangular shape having a width 26, a height 27 and a depth 28. The R.F. recess in block 32 has corresponding dimensions 26 and 27 for width and height, respectively; the depth 29 is, as aforesaid, a quarter wave length of the R.R. frequency, the recess terminating in an end wall 30.

Means are provided for applying an R.F. signal to the R.F. port; for example, a standard R.F. adapter may be attached by appropriate screw means to the block 12 utilizing a plurality of threaded apertures 24.

Referring again to the elongated flat stripline base member 50, one side thereof is depicted clearly in FIG. 1 and the other side is shown in FIG. 2. As indicated, the stripline base member 50 may comprise a plastic material such as soft duroid strip 51 to which is applied thin copper sections, as will be set forth in greater detail below.

A first planar microstrip means is provided on the stripline base member 51 extending from the first end 40 of the housing and in register with the second deep recess, i.e., recess 34 in block member 32. The first planar microstrip means comprises copper strips 52, 53, 54, and 55 on the side of the microstrip visible in FIG. 1, and copper strip portions 66 and 67 on the back side of the microstrip as shown in FIG. 2. It will be noted that copper portion 54 commences at the lower surface of the microstrip and flares upwardly to the longitudinally extending center section 55. Conversely, on the back side, copper portion 66 starts near the upper edge or surface of the microstrip and then flares downwardly and flaring into the longitudinally extending copper strip portion 67, portion 67 extending to a point identified by reference numeral 36' which is in register with the end wall 36 of the recess 34. Note also in FIG. 1 the reference numeral 36", which also is in register with end wall 36; reference numeral 36" indicating the end of the first planar microstrip means and the beginning of a second planar microstrip means which extends from that point to the right as shown in FIG. 1 throughout the remainder of the elongated flat stripline base member. Beginning at reference line 36", and proceeding to the right in FIG. 1, it is seen that the continuation of copper strip 52 is identified by reference numeral 52'; the continuation of copper strip 53 by reference numeral 53' and that copper strip 55 terminates a short distance to the right of reference line 36", following which there is a short gap 56 followed by another longitudinally extending copper strip 57 which extends through and past the R.F. port reference axis 25'. At the right end of copper strip 57 is a low pass filter arrangement comprising large rectangular copper sections 58, 60, and 62 respectively interconnected by smaller longitudinally extending strips 59 and 61, the low pass filter being selected so as to block the R.O. signal, but to permit the passage therethrough of an intermediate frequency (I.F.) signal. Also, referring to FIG. 2, it will be noted that beginning at reference line 36' and going to the left, the entire surface of this side of base portion 51 has a copper surface thereon with the exception of an aperture 69 which has the identical dimensions as those of the R.F. port 25 (represented by width 26' and height 27'; the axis of aperture 69 is aligned with axis 25'. The remainder of the copper surface for this side of base 51 is identified by reference numeral 68.

A pair of mixer diodes 70 and 71 are connected in series between copper portions 53', 57 and 52', as is shown in more detail in FIG. 3. To clarify, diode 70 is connected between center section 57 and the upper copper strip 52' and the diode 71 is connected from the lower copper strip 53' to the center copper strip 57. The diodes are connected in the same sense, i.e., in series, and also the diodes are located directly in line with the axis of the R.F. port 25, i.e., axis 25'. FIGS. 1 and 4 show attachment details of the I.F. output means to the microstrip; a suitable I.F. output connector 91 having an output connection means 92 with a portion 93 thereof having a conductor 94 electrically bonded to the copper section 62 on the microstrip. The I.F. connector 91 further has a plurality of apertures 96 for use in attaching the I.F. connector to the mixer.

Referring to FIG. 5, it will be noted that the two block members 12 and 32 are shown in abutting relationship with the elongated relatively shallow recesses 18 and 42 collectively defining the elongated enclosure extending from one end of the housing member to the other and forming therefore an enclosure for the elongated flat stripline base member 50. Further, the relatively deep enclosure 14 is clearly depicted in FIG. 5 and, through the use of dotted lines, the shorter but relatively deep recess 34 is also depicted. In addition, the R.F. port 25 is shown extending completely through block member 12 and partially into block member 32 terminating at end wall 35.

In operation a local oscillator signal is applied to the L.O. port. The first planar microstrip means functions as a wave guide to microstrip transition to couple the local oscillator signal to the matched pair of mixer diodes 70 and 71. The diodes bonded on the substrate are excited out of phase by the local oscillator signal; they are excited in phase by the R.F. input signal which travels down the R.F. port from the source of R.F. signals coupled to block 12 through the attachment means 24. The result is a symmetry type hybrid junction in which the R.F. signal to local oscillator isolation is inherently high and independent of frequency. The I.F. output is extracted by the microstrip low pass filter 58-62 which filter rejects the local oscillator energy. Due to the junction symmetry properties of the diodes, there will be no R.F. signal on the microstrip lines; consequently, the I.F. output filter has no impact on the R.F. signal matching. This contributes significant improvement to the band and conversion loss.

While most conventional microstrip line mixers are only suitable for narrow band width applications, the present invention eliminates the prior art problems by using a frequency independent hybrid junction. Further, in the present invention the whole circuit can be built on a single substrate which permits low cost construction and very high reliability even in adverse environments.

A typical range of L.O. frequencies is 26 to 100 GHz, a typical range of R.F. frequencies is 26 to 100 GHz, and a typical range of I.F. frequencies is 0 to 14 GHz.

While I have described a preferred embodiment of the invention it will be understood that the invention is limited only by the scope of the following claims:

I claim:

1. A millimeter-wave stripline planar wide-band mixer comprising:
 (a) an elongated housing member having a first end and a second end;
 (b) an elongated enclosure extending from one end of said housing member to the other end thereof;
 (c) an elongated flat stripline base member positioned in said elongated enclosure;
 (d) a first relatively deep recess in said housing member extending from said enclosure along one side of the entire length of said stripline member;
 (e) a second relatively deep recess in said housing member extending from said enclosure along a relatively short portion of the other side of said stripline member beginning at said first end of said housing member;
 (f) a radio frequency (R.F.) port passing into said housing member intersecting at a right angle with said first deep recess, and also extending into said housing member a quarter wave length beyond said elongated enclosure;
 (g) first planar microstrip means on said stripline base member extending from said first end of said housing member in register with said second deep recess in said housing;
 (h) second planar microstrip means on said stripline base member having a first end connected to said first planar microstrip means and extending therefrom to the second end of said housing member;
 (i) a matched pair of mixer diodes connected in series and also connected to said second planar microstrip means at a location substantially in register with the axis of said R.F. port;
 (j) means for applying a local oscillator (L.O.) signal to said first end of said housing and to the ends of said first and second relatively deep recesses which collectively define a local oscillator port and thus to an end of said first planar microstrip means;
 (k) means for applying a R.F. signal to said R.F. port and thence to impinge on said pair of mixer diodes to thereby mix with said L.O. signal and to produce an intermediate frequency (I.F.) signal;
 (l) I.F. output means attached to the other end of said housing, said I.F. output means being connected to the other end of said second planar microstrip means; and (m) filter means associated with said second planar microstrip means located between said I.F. output means and said pair of mixer diodes.

2. Apparatus of claim 1 further characterized by said stripline base member being of a soft duroid material.

3. Apparatus of claim 1 further characterized by said first planar microstrip means comprising tapered metallic portions disposed asymmetrically on opposite sides of said stripline base member to thereby form a wave guide to microstrip transition.

4. Apparatus of claim 3 further characterized by said filter means being of the low pass type so as to permit the passage therethrough of the I.F. signal to said I.F. output means.

5. Apparatus of claim 4 further characterized by said first and second planar microstrip means collectively constituting a millimeter wave transmission line adapted to (i) receive a L.O. signal at one end which signal is transmitted to the mixer diodes, (ii) receive the R.F. signal at the mixer diodes, and (iii) transmit the I.F. signal from the mixer diodes to the I.F. output means.

6. Apparatus of claim 1 further characterized by said housing member comprising first and second rectangularly shaped block members each having a flat face surface, said block members being connected together with said flat faces in abutting relationship.

7. Apparatus of claim 6 further characterized by said block members each having an elongated relatively shallow recess in said flat face surface thereof, said shallow recesses jointly defining said elongated enclosure.

8. Apparatus of claim 7 further characterized by said first planar microstrip means comprising tapered metallic portions disposed asymmetrically on opposite sides of said stripline base member to thereby form a wave guide to microstrip transition.

9. Apparatus of claim 8 further characterized by said filter means being of the low pass type so as to permit the passage therethrough of the I.F. signal to said I.F. output means.

10. Apparatus of claim 9 further characterized by said first and second planar microstrip means collectively constituting a millimeter wave transmission line adapted to (i) receive a L.O. signal at one end which signal is transmitted to the mixer diodes, (ii) receive the R.F. signal at the mixer diodes, and (iii) transmit the I.F. signal from the mixer diodes to the I.F. output means.

* * * * *